(12) United States Patent
Hwang

(10) Patent No.: US 9,729,207 B2
(45) Date of Patent: Aug. 8, 2017

(54) HEAT DISSIPATION MEMBER AND PORTABLE TERMINAL HAVING SAME

(71) Applicant: AMOGREENTECH CO., LTD., Gimpo-si (KR)

(72) Inventor: Seung Jae Hwang, Incheon (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 0 days.

(21) Appl. No.: 15/029,070

(22) PCT Filed: Oct. 31, 2014

(86) PCT No.: PCT/KR2014/010387
§ 371 (c)(1),
(2) Date: Apr. 13, 2016

(87) PCT Pub. No.: WO2015/065117
PCT Pub. Date: May 7, 2015

(65) Prior Publication Data
US 2016/0255184 A1    Sep. 1, 2016

(30) Foreign Application Priority Data

Oct. 31, 2013   (KR) .................. 10-2013-0131033
Oct. 31, 2014   (KR) .................. 10-2014-0149709

(51) Int. Cl.
*H04B 5/00* (2006.01)
*H04M 1/02* (2006.01)
*H05K 7/20* (2006.01)

(52) U.S. Cl.
CPC ......... *H04B 5/0056* (2013.01); *H04B 5/0031* (2013.01); *H04M 1/026* (2013.01); *H05K 7/20472* (2013.01); *H05K 7/20481* (2013.01)

(58) Field of Classification Search
USPC .................... 455/41.1–41.3, 550.1
See application file for complete search history.

(56) References Cited

U.S. PATENT DOCUMENTS

2009/0087640 A1*  4/2009  Li ............... H05K 7/20981
                                           428/304.4
2013/0192813 A1*  8/2013  Yoon ................ F28F 21/02
                                           165/185
2014/0103505 A1*  4/2014  Zhao ............. H01L 23/49551
                                           257/675

FOREIGN PATENT DOCUMENTS

| JP | 2012191654 | 10/2012 |
| KR | 20100121680 | 11/2010 |
| KR | 101049109 | 7/2011 |
| KR | 20110090698 | 8/2011 |
| KR | 101134880 | 4/2012 |

(Continued)

OTHER PUBLICATIONS

International Search Report—PCT/KR2014/010387 dated Feb. 23, 2015.

*Primary Examiner* — Fayyaz Alam
(74) *Attorney, Agent, or Firm* — Cantor Colburn LLP

(57) ABSTRACT

Provided are a heat radiation member and a mobile terminal having the same, in which the heat radiation member includes: a heat radiation sheet configured to disperse and radiate transferred heat and block and insulate transferred heat; and a passage formed in the heat radiation sheet and configured to pass a communication radio signal, wherein the passage comprises at least one punching area penetrating the heat radiation sheet.

10 Claims, 19 Drawing Sheets
(7 of 19 Drawing Sheet(s) Filed in Color)

(56) References Cited

FOREIGN PATENT DOCUMENTS

| KR | 101161735 | 7/2012 |
|---|---|---|
| KR | 20130027690 | 3/2013 |

* cited by examiner

FIG. 8

| NFC Antenna | Sheet | BRIDGE WIDTH (mm) | Offset ONE-WAY/TW O-WAY (mm) | Slot | Communication Distance (mm) | | | EMV Load Modulation Vpp (mV) | | | |
|---|---|---|---|---|---|---|---|---|---|---|---|
| | | | | | Card Mode AOR122U ≥25 | 1K ≥30 | EV1 ≥15 | (0,0,0) ≥8.8 | (1,0,0) ≥7.2 | (2,0,0) ≥5.8 | (3,0,0) ≥4 |
| | NONE | NONE | NONE | NONE | 40 | 40 | 20 | 22.00 | 20.00 | 13.00 | 7.00 |
| U Project | Sample #1 | 5 | 1mm/2mm | 1 | 19 | 28 | 10 | 23.31 | 11.72 | 5.19 | × |
| | | 5 | 1mm/2mm | 4 | 20 | 28 | 10 | 23.96 | 11.80 | 5.40 | × |
| | Sample #2 | 5 | 1.5mm/3mm | 1 | 28 | 31 | 19 | 26.54 | 15.02 | 8.59 | 4.07 |
| | | 5 | 1.5mm/3mm | 4 | 30 | 31 | 19 | 26.67 | 15.16 | 8.79 | 4.45 |
| | Sample #3 | 10 | 1.5mm/3mm | 1 | 24 | 28 | 15 | 26.39 | 14.18 | 7.89 | 3.99 |
| | | 10 | 1.5mm/3mm | 4 | 25 | 28 | 15 | 26.76 | 14.49 | 7.42 | 3.92 |

HEAT DISSIPATION MEMBER AND PORTABLE TERMINAL HAVING SAME

TECHNICAL FIELD

The present invention relates to a heat radiation member, and more particularly, to a heat radiation member that may radiate and block heat and a mobile terminal having the same, in which heat generated from a hot spot in the mobile terminal is efficiently radiated and insulated, to thus minimize the thermal influence applied to internal components in the mobile terminal, and block the heat generated from the hot spot from leaking to the outside.

BACKGROUND ART

In recent years, electronic products including mobile terminals are continuously evolving, and are promoting high performance and multi-function according to user's needs.

In particular, mobile terminals are required to be compact in size and light in weight to maximize the user's portability and convenience, and integrated components are being mounted in a small space for the high-performance. Accordingly, components used in mobile terminals become increasingly high performance to thus increase heating temperature. The increased heating temperature makes an influence upon adjacent components to thus cause the performance of the mobile terminals to be lowered.

A variety of insulating materials are applied in mobile terminals in order to solve the problems due to heat generated from the mobile terminals, but optimum insulation materials that are thin and has excellent heat insulation performance have not been developed yet. Thus, a technology of insulation is variously under research and development.

Korean Patent Registration Publication No. 10-1134880 disclosed a mobile terminal including a heat insulation film arranged in front of a liquid crystal display (LCD), showing an advantage of preventing the heat generated from the mobile terminal from being delivered to a user's face through the LCD. However, since the insulation film may not show the specific configuration, and the heat insulation performance, a problem of heat generated from an up-to-date high performance mobile terminal may not be solved.

Thus, the present inventors have continuously studied a technology of a heat radiation member for radiating and blocking heat generated from a hot spot of a mobile terminal to thus provide excellent heat radiating and insulating performance, and have derived and invented structural features of the heat radiation member that can sequentially perform heat radiation and heat insulation, and allow radio signals for communications to enter and exit the heat radiation member, to thus have completed the heat radiation member that is more economical, utilizable, and competitive.

DISCLOSURE

Technical Problem

To solve the above problems or defects, it is an object of the present invention to provide a heat radiation member and a mobile terminal having the same, in which heat generated from a hot spot in a mobile terminal is efficiently radiated and insulated by the heat radiation member, to thus minimize the thermal influence applied to internal components in the mobile terminal, and block the heat generated from the hot spot from leaking to the outside.

It is another object of the present invention to provide a heat radiation member and a mobile terminal having the same, in which a passage for passing a communication radio signal is provided in the heat radiation member, to thus minimize a failure in performing a communication function such as Near Field Communication (NFC) of the mobile terminal and perform a communication function of the mobile terminal seamlessly.

It is still another object of the present invention to provide a heat radiation member and a mobile terminal having the same, in which a nanofiber web arranged in a three-dimensional network structure or a nonwoven fabric is included in the heat radiation member, to thus improve heat insulating performance by using nano-sized fine pores of the nanofiber web having a large heat blocking capability or the nonwoven fabric.

Technical Solution

To accomplish the above and other objects of the present invention, according to an aspect of the present invention, there is provided a heat radiation member comprising: a heat radiation sheet configured to disperse and radiate transferred heat and block and insulate transferred heat; and a passage formed in the heat radiation sheet and configured to pass a communication radio signal, wherein the passage comprises at least one punching area penetrating the heat radiation sheet.

In addition, according to another aspect of the present invention, there is provided a heat radiation member comprising: a heat radiation sheet configured to disperse and radiate transferred heat and block and insulate transferred heat; and a passage formed in the heat radiation sheet and configured to pass a communication radio signal, wherein the passage comprises at least one punching area penetrating the heat radiation sheet, and wherein the heat radiation sheet comprises: a heat diffusion layer to diffuse heat in the horizontal direction; a first adhesive layer laminated on one surface of the heat diffusion layer; a second adhesive layer laminated on the other surface of the heat diffusion layer; a heat insulation layer laminated on the first adhesive layer to prevent heat from being transferred in the vertical direction; and a protective cover layer laminated on the heat insulation layer to protect the heat insulation layer.

In addition, according to another aspect of the present invention, there is provided a heat radiation member comprising: a heat radiation sheet configured to disperse and radiate transferred heat and block and insulate transferred heat; and a passage formed in the heat radiation sheet and configured to pass a communication radio signal, wherein the heat radiation sheet comprises: an unpunching area; first through fourth punching areas; and an island area formed inside the first through fourth punching areas, and wherein the passage is the first through fourth punching areas and the first through fourth punching areas are spaced apart from the neighboring punching areas with bridges that connect the first through fourth punching areas to the unpunching area.

Further, according to another aspect of the present invention, there is provided a mobile terminal comprising: a mobile terminal main body configured to perform a mobile terminal function; a removable rear cover on the back of the mobile terminal main body; and a heat radiation member provided in the inside of the rear cover, wherein the heat radiation member comprises: a heat radiation sheet configured to disperse and radiate transferred heat and block and insulate transferred heat; and a passage formed in the heat radiation sheet and configured to pass a communication radio signal, wherein the passage comprises at least one punching area penetrating the heat radiation sheet.

In addition, according to another aspect of the present invention, there is provided a mobile terminal comprising: a heat radiation sheet configured to disperse and radiate transferred heat and block and insulate transferred heat; and a passage formed in the heat radiation sheet and configured to pass a communication radio signal, wherein the passage comprises at least one punching area penetrating the heat radiation sheet, and wherein the heat radiation sheet comprises: a heat diffusion layer to diffuse heat in a horizontal direction; a heat insulation layer laminated on one side of the heat diffusion layer; an adhesive layer laminated on the other side of the heat diffusion layer.

Advantageous Effects

As described above, the present invention provides a heat radiation member that may perform heat radiation and heat insulation by dissipating and blocking heat and a mobile terminal having the same, in which heat generated from a hot spot in the mobile terminal is efficiently radiated and insulated, to thus minimize the thermal influence applied to internal components in the mobile terminal, and block the heat generated from the hot spot from leaking to the outside, thereby minimize heat delivered to a user who grips the mobile terminal.

In the present invention, at least one punching area is formed in a heat radiation sheet, and a communication radio signal passes through the at least one punching area, to thereby minimize interference at the time of performing a communication function such as Near Field Communication (NFC) of the mobile terminal and perform a communication function of the mobile terminal seamlessly.

In the present invention, a heat diffusion layer diffuses heat generated from heat generating components of the mobile terminal, and a heat insulation layer blocks heat generated from heat generating components from being transferred to other components, to thus provide a heat radiation sheet capable of performing a heat diffusion function and a heat insulation function simultaneously.

In the present invention, an anti-oxidation layer is provided on a surface of the heat diffusion layer of the heat radiation sheet, to thereby provide an effect of preventing the heat diffusion layer from being oxidized.

In the present invention, a conductive adhesive layer is formed on one surface of the heat diffusion of the heat radiation sheet to thus primarily diffuse the heat transferred to the heat diffusion layer and the heat is transferred to other heat diffusion members attached to the conductive adhesive layer to thus secondarily diffuse the heat, to thus improve heat radiation performance.

In the present invention, when a colored layer is formed on one surface of the heat diffusion layer of the heat radiation sheet to thereby attach the heat radiation sheet to a cover, there is an advantage that a color of the cover is the same as a color that is exposed to the outside of the heat radiation sheet.

DESCRIPTION OF DRAWINGS

The patent or application file contains at least one drawing executed in color. Copies of this patent or patent application publication with color drawings will be provided by the Office upon request and payment of the necessary fee.

FIG. 8 is a table showing data as a result of testing a communication distance and an authentication item of a heat radiation sheet applied to a mobile terminal in accordance with an embodiment of the present invention.

BEST MODE

Figure 1:
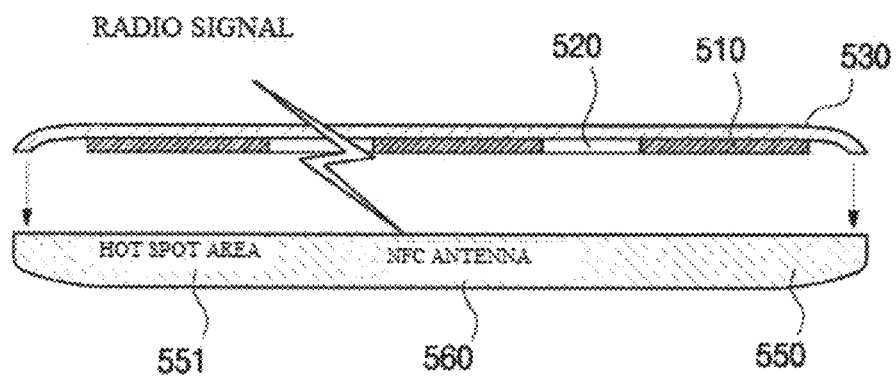
FIG. 1 is a conceptual cross-sectional view of a heat radiation member according to an embodiment of the present invention.

Hereinafter, a heat radiation member and a mobile terminal having the same according to embodiments of the present invention will be described with reference to the accompanying drawings. In the process, the sizes and shapes of components illustrated in the drawings may be shown exaggerated for convenience and clarity of explanation. Further, by considering the configuration and operation of the present invention, the specifically defined terms may be changed according to user's or operator's intention, or the custom. Definitions of these terms herein need to be made based on the contents across the whole application.

Referring to FIG. 1, a heat radiation member according to an embodiment of the present invention includes: a heat radiation sheet 510 configured to disperse and radiate transferred heat and block and insulate transferred heat; and a passage formed in the heat radiation sheet 510 and configured to pass a communication radio signal, wherein the passage comprises at least one punching area 520 penetrating the heat radiation sheet 510. Here, dispersion of heat in the embodiment of the present invention is defined in the same terminology as diffusion of heat, as discussed below, and the at least one punching area 520 is formed by punching at least one area from among an edge area, a central area, and a mixed area of the edge area and the central area of the heat radiation sheet 510.

Such a heat radiation member according to an embodiment of the present invention may be mounted on a mobile terminal. When the heat radiation sheet may be mounted on the mobile terminal, the heat radiation member may perform heat radiation and heat insulation by dissipating and blocking heat generated from a hot spot in the mobile terminal, in which heat generated from the hot spot in the mobile terminal is efficiently radiated and insulated, to thus minimize the thermal influence applied to internal components in the mobile terminal, and block the heat generated from the hot spot from leaking to the outside, thereby minimize heat delivered to a user who grips the mobile terminal.

Further, in the case that the heat radiation member according to an embodiment of the present invention is mounted in the mobile terminal, since the heat radiation member may be an obstacle in performing a communication function such as a Near Field Communication (NFC) for a mobile terminal, a passage through which a communication radio signal passes is provided in the heat radiation sheet 510, to thus provide an advantage to facilitate the communication function of the mobile terminal.

As shown in FIG. 1, in the case of the radiation member according to the embodiment of the present invention, it is preferable to provide a radiation sheet 510 of the heat radiation member in an inner side of a rear cover 530 of the mobile terminal. Here, the mobile terminal includes: a mobile terminal main body 550 that performs functions of the mobile terminal; and the rear cover 530 that is detachably mounted on a rear surface of the mobile terminal main body 550. There are mounting areas in the rear surface of the mobile terminal main body 550 so that a battery, a memory chip, etc. may be mounted in the mounting areas. In order to easily replace the battery, the memory chip, etc. with new ones and to the aesthetics of the mobile terminal, the rear cover 530 is detachably mounted on the rear surface of the mobile terminal main body 550. Here, the rear cover 530 may be referred to as a battery cover.

High-speed and high-performance chips are built in the mobile terminal main body 550, and when the chips are activated, a hot spot area 551 is made to concentratively generate heat in a localized area. Since the heat radiation sheet 510 of the heat radiation member is mounted on the inside of the rear cover 530, when the heat radiation sheet 510 is combined with the mobile terminal main body 550 (when coupled in the direction of an arrow in FIG. 1), the heat radiation sheet 510 is close to the hot spot area 551, and thus receives heat generated in the hot spot area 551 and performs heat dissipation and blocking functions.

Then, a communication antenna provided on the mobile terminal main body 550, for example, a NFC antenna 560 of FIG. 1 may smoothly transmit and receive radio signals to and from an external device (not shown) through the punching area 520 of the heat radiation sheet 510. Accordingly, although the heat radiation member is mounted to the rear cover of the mobile terminal, a communication failure does not occur.

A variety of communication methods may be applied to implement the communication function for the mobile terminal, but a communication function of a NFC system is preferably included in the mobile terminal.

The NFC system is a non-contact short-range radio communication system using a 13.56 MHz frequency band, and is a communication protocol developed for transmitting data between terminals that are positioned at a close distance of about 10 cm from each other. The NFC system is widely used for transmission of payments as well as product information in a supermarket or general store and travel information for visitors, transportation and access control locks, etc.

Figure 2:
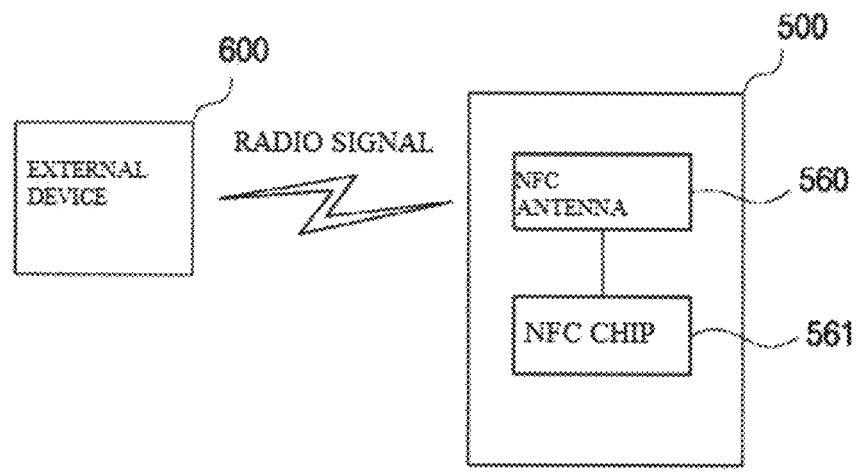
FIG. 2 is an exemplary conceptual block diagram for explaining a communication function of a mobile terminal provided with a heat radiation member according to an embodiment of the present invention.

Referring to FIG. 2, the mobile terminal 500 may include a NFC chip 561 to enable communication such as the NFC system. The NFC chip 561 may exchange data at a short distance with an external device 600 such as another terminal or a reader according to the NFC communication standard via a NFC antenna 560. Here, the mobile terminal 500 transmits and receives a radio signal via the NFC system, to thus exchange data with the external device 600 thereby performing the communication such as the NFC system.

Figure 3:
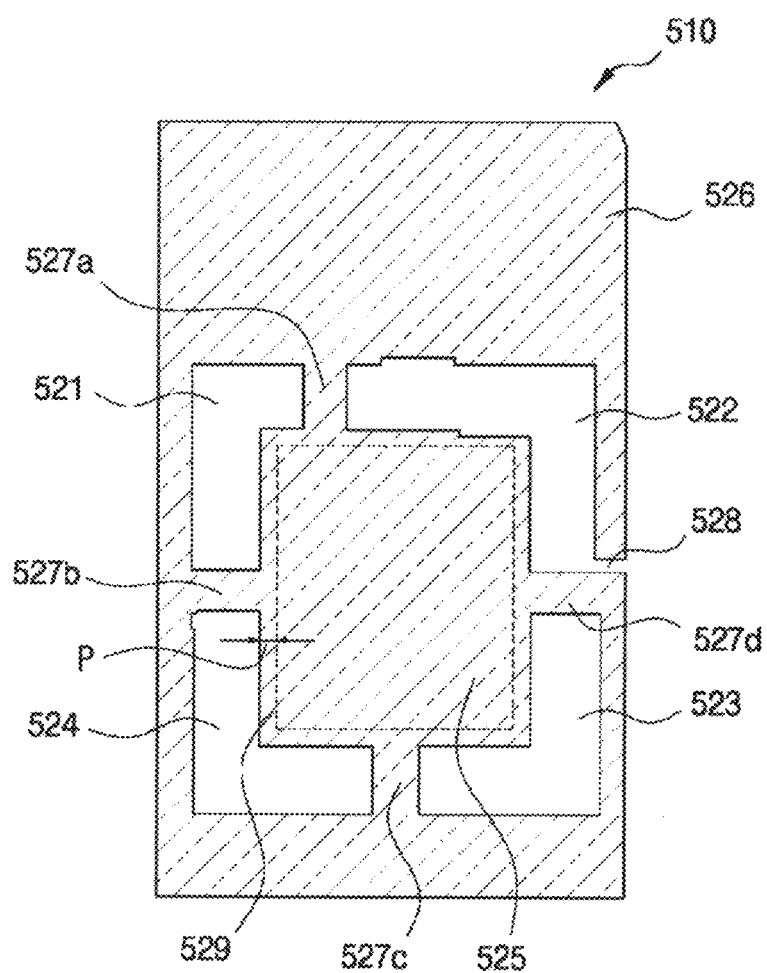
FIG. 3 is a schematic plan view illustrating a heat radiation sheet of a heat radiation member according to an embodiment of the present invention.

Referring to FIG. 3, the heat radiation sheet 510 of the heat radiation member according to an embodiment of the present invention is formed of a flat plate-like shape, and includes at least one punching area 521, 522, 523, or 524 penetrating the heat radiation sheet as a passage through which a communication radio signal passes.

In this case, the punching areas of the heat radiation sheet 510 are preferably formed of first to fourth punching areas 521, 522, 523, and 524 that are punched in an "L-shaped" form. By the first to the fourth punching areas 521, 522, 523, and 524, a rectangular island area 525 is formed in an inner area surrounded by the first to the fourth punching areas 521, 522, 523, and 524. The first to the fourth punching areas 521, 522, 523, and 524 are spaced from the adjacent punching areas via bridges 527a, 527b, 527c, and 527d connecting an unpunching area 526 and the island area 525. Here, the width of the bridges 527a, 527b, 527c, and 527d is preferably less than or equal to 5 mm. When the width of the bridges 527a, 527b, 527c, and 527d is more than 5 mm, the NFC standard is not met due to the short communication distance.

In addition, in order to increase strengths of radio signals transmitted and received by the NFC antenna, at least one slot may be additionally formed in which the at least one slot opens one of the first to fourth punching areas 521, 522, 523, and 524 to the outside. That is, referring to FIG. 3, a slot 528 which opens the second punching area 522 to the outside is formed to thus make the radiation sheet 510 as an open loop, to thereby improve inductive coupling.

There exists an area 529 which is in contact with the NFC antenna, in the island area 525. The size of the island area 525 is larger than the size of the area 529 that is in contact with the NFC antenna. Here, in some embodiments of the present invention, a distance from an edge of the area 529 that is in contact with the NFC antenna to an edge of the island area 525 is defined as an offset P. It is preferable that the offset is 1.5 mm or less, and when the offset is more than 1.5 mm, the NFC standard is not met due to the short communication distance.

Figure 4:
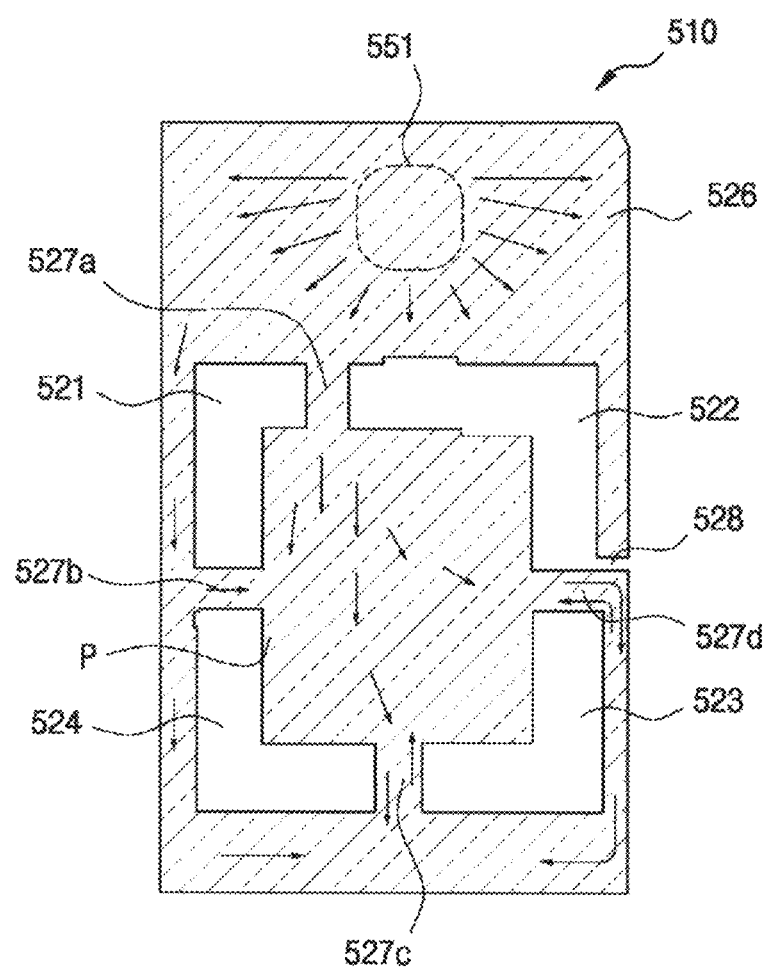
FIG. 4 is a conceptual plan view illustrating a heat flow in a heat radiation sheet of a heat radiation member in accordance with an embodiment of the present invention.

Referring to FIG. 4, the unpunching area 526 in the heat radiation sheet 510 of the heat radiation member according to an embodiment of the present invention is in contact with the hot spot area 551, and the heat generated in the hot spot area 551 is dispersed over the entire areas of the heat radiation sheet 510 through bridges 527a, 527b, 527c, and 527d in the heat radiation sheet 510.

Figure 5:
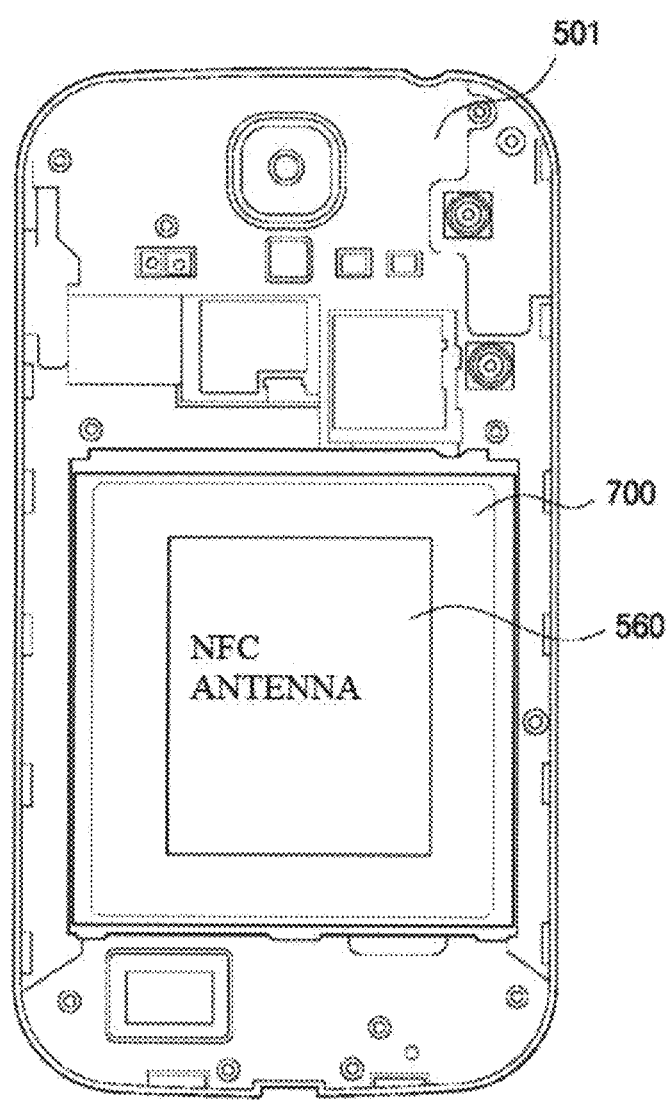
FIG. 5 is a photograph of a state where a Near Field Communication (NFC) antenna is provided on the back of a mobile terminal according to an embodiment of the present invention.
Figure 6:
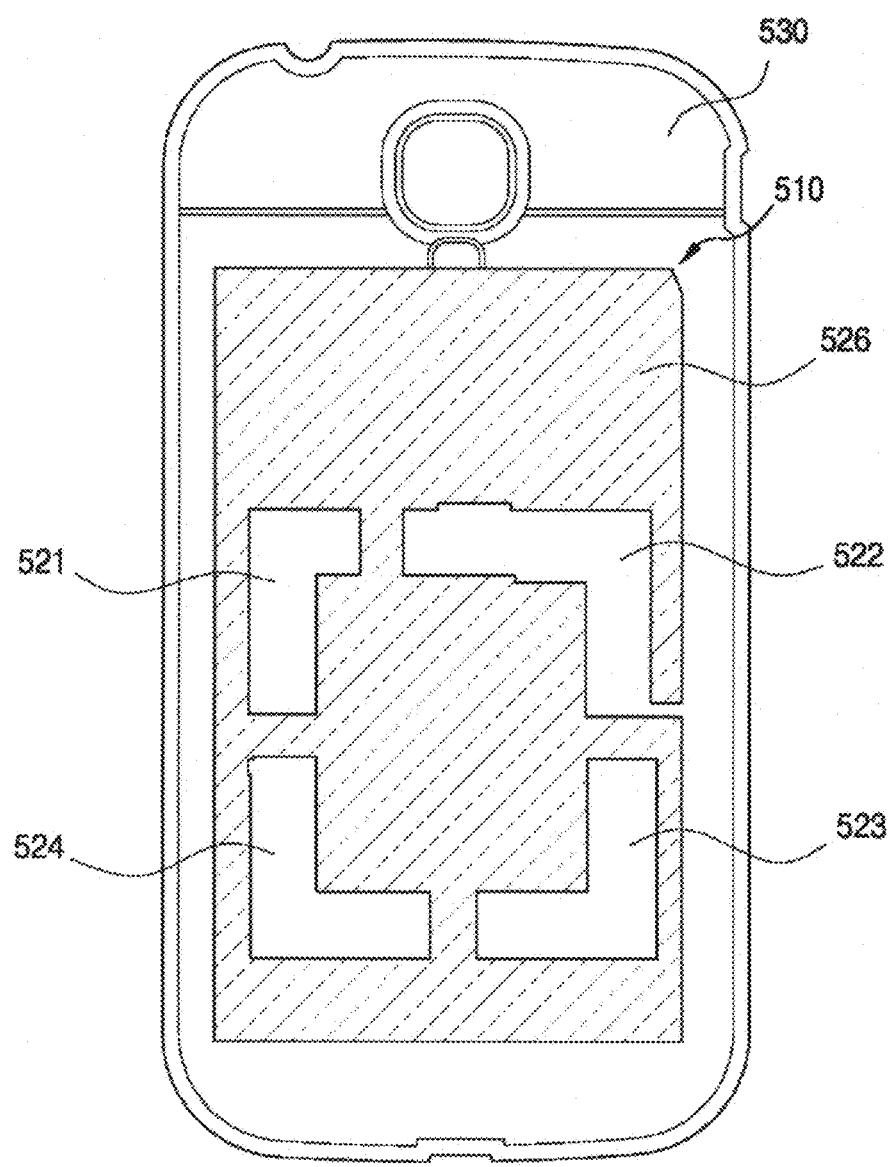
FIG. 6 is a photograph of a state where a heat radiation member is provided on a rear cover of a mobile terminal according to an embodiment of the present invention.

Referring to FIG. 5, a battery 700 is mounted on the rear surface 501 of the mobile terminal according to an embodiment of the present invention. It is preferable that the NFC antenna 560 is installed on the battery 700. As shown in FIG. 6, the heat radiation sheet 510 of the heat radiation member is mounted on the rear cover of the mobile terminal.

Figure 7:
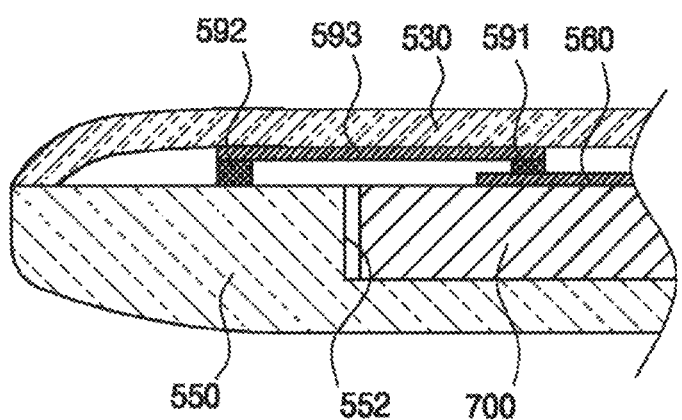
FIG. 7 is a conceptual partial sectional view illustrating a state where a NFC chip and an NFC antenna of a mobile terminal are electrically connected with each other in accordance with an embodiment of the present invention.

Referring to FIG. 7, a groove 552 is formed on the rear surface of the mobile terminal main body 550, in which the battery 700 may be mounted in the groove 552. That is, the battery 700 is inserted and fixed in the groove 552.

In some embodiments of the present invention, the NFC antenna 560 is preferably attached to the battery 700, and a NFC chip (not shown) is built in the mobile terminal main body 550. Since the battery 700 may be detachably mounted in the groove 552, a wiring that directly connects the NFC antenna 560 and the NFC chip (not shown) may not be laid.

Therefore, according to some embodiments of the present invention, a first contact 591 is provided in the NFC antenna 560, and a second contact 592 connected to the NFC chip is provided on the rear surface of the mobile terminal main body 550. A wiring line 593 connecting the first and second contacts 591 and 592 is provided on the rear surface of the rear cover 530. That is, when the rear cover 530 is detached from the rear surface of the mobile terminal main body 550, the wiring line 593 is also released from the first and second contacts 591 and 592, and thus the first and second contacts 591 and 592 are not electrically energized. On the contrary, when the rear cover 530 is coupled from the rear surface of the mobile terminal main body 550, the wiring line 593 electrically connects the first and second contacts 591 and 592, and thus NFC antenna 560 and the NFC chip are electrically connected.

Figure 9:
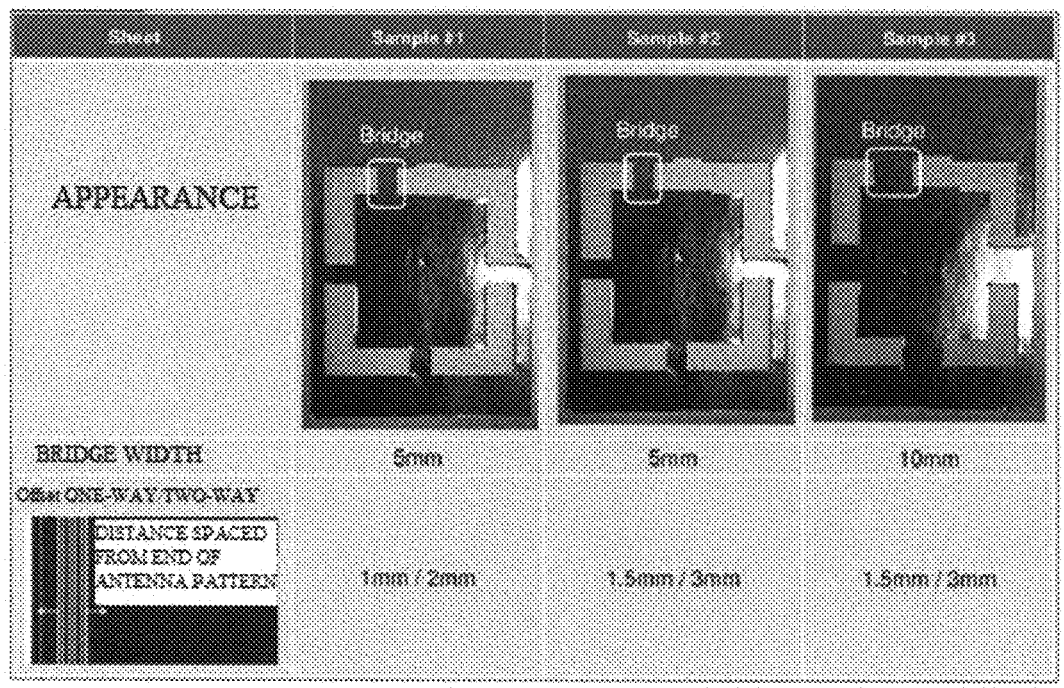
FIG. 9 shows photographs for explaining conditions of a heat radiation sheet having undergone a test of FIG. 8.

FIG. 8 is a table showing data as a result of testing a communication distance and an authentication item of a heat radiation sheet applied to a mobile terminal in accordance with an embodiment of the present invention, and FIG. 9 shows photographs for explaining conditions of a heat radiation sheet having undergone a test of FIG. 8.

As shown in FIG. 9, the heat radiation sheets (Sample #1, Sample #2, and Sample #3) (a single slot) of the heat radiation members in accordance with some embodiments of the present invention, were prepared to have widths of the bridges of 5 mm and 10 mm, and a one-way offset (a distance from one edge of an area where the NFC antenna contacts to one edge of an island area) of 1 mm or 1.5 mm, and a two-way offset (a distance summed in both sides of a distance from one edge of an area where the NFC antenna contacts to one edge of an island area) of 2 mm or 3 mm. Data as a result of testing a communication distance and an authentication item of a mobile terminal employing each of the heat radiation sheets of FIG. 9 and data as a result of testing a communication distance and an authentication item of a mobile terminal employing no heat radiation sheets is illustrated in FIG. 8.

Referring to FIG. 8, in a mobile terminal employing each of the heat radiation sheets (Sample #1, Sample #2, and Sample #3) of the heat radiation members in accordance with some embodiments of the present invention, both the communication distance and the authentication item are satisfied only in the Sample #2, and the communication distance performance is a little reduced in the Sample #1 and Sample #3. Vpp of EMV Load Modulation that is the authentication item satisfies only (0, 0, 0) in which an external device and the mobile terminal have been in close contact with each other, (1, 0, 0) in which the external device and the mobile terminal have an interval of 1 cm, and (2, 0, 0) in which the external device and the mobile terminal have an interval of 2 cm. No voltage has been detected or a feeble voltage has been detected at (3, 0, 0) in which the external device and the mobile terminal have an interval of 3 cm. Note that a 'Card Mode' is a transmit mode and a 'Reader Mode' is a receive mode in a communication distance.

Thus, it can be seen that the heat radiation sheet of the heat radiation member in accordance with an embodiment of the present invention satisfies the communication distance and the authentication item when a bridge width is less than or equal to 5 mm, and the one-way offset is greater than or equal to 1.5 mm.

Figure 10:
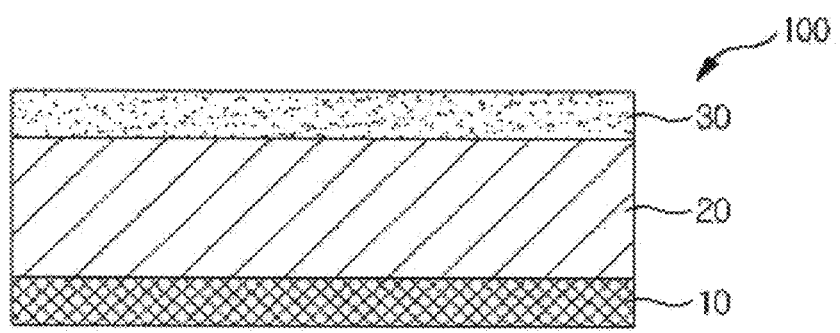
FIG. 10 is a cross-sectional view of a heat radiation sheet according to a first embodiment of the present invention.

FIG. 10 is a cross-sectional view of a heat radiation sheet according to the first embodiment of the present invention.

As shown in FIG. 10, the heat radiation sheet 100 according to the first embodiment includes: a heat diffusion layer 20 that diffuses heat in the horizontal direction; a heat insulation layer 10 that is laminated on one surface of the heat diffusion layer 20 and blocks heat from being transferred in the vertical direction; and an adhesive layer 30 that is laminated on the other surface of the heat diffusion layer 20.

The heat diffusion layer 20 is formed of a metal having thermal conductivity. For example, Al, Ni, Cu, Ag and alloys thereof may be used as the heat diffusion layer 20, and Cu of high thermal conductivity may be preferably used as the heat diffusion layer 20.

The heat diffusion layer 20 quickly diffuses heat generated by a heat generating component in the horizontal direction, to thereby prevent high-temperature heat from being locally generated and thus prevent the heat generating component and other components from being damaged by high-temperature heat.

The heat diffusion layer 20 may employ any material that may rapidly diffuse heat in the horizontal direction, in addition to a heat conductive metal. For example, graphite may also be applied as the heat diffusion layer.

The heat insulation layer 10 is formed of a porous thin film that may block heat transmitted in the vertical direction.

The heat insulation layer 10 employs, for example, a nanofiber web type having a plurality of pores according to an electrospinning method, a nonwoven fabric having a plurality of pores, PES (polyether sulfone), and the like. Any material having a plurality of pores and allowing vertical insulation may be applied as the heat insulation layer 10. Here, the pore size of the heat insulation layer 10 is preferably approximately from tens nm to 10 µm.

Figure 11:
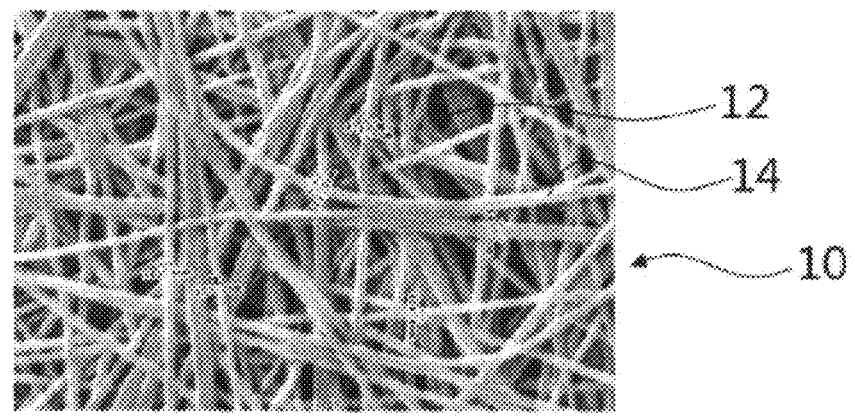
FIG. 11 is a photograph viewed as a magnification of the heat insulation layer according to the first embodiment of the present invention.

As shown in FIG. 11, when the heat insulation layer 10 is formed of the nanofiber web type, a polymer material that may be electrospun and excellent heat resistance is mixed with a solvent at a predetermined ratio to thus create a spinning solution, and then the spinning solution is electrospun to thereby form nanofibers 14. Then, the nanofibers 14 are accumulated to form a nanofiber web having a plurality of pores 12 in a nanofiber web type.

As the diameters of the nanofibers 14 are smaller, the specific surface areas of the nanofibers 14 are increased, and an air trap ability of the nanofiber web having a plurality of fine pores is increased, thereby improving the heat insulation performance. Thus, it is preferable that the diameters of the nanofibers 14 should be in the range of 0.1 µm-5 µm, preferably in the range of 0.3 µm-3 µm. The heat insulation layer 10 may be designed to have a thickness of 5 µm-30 µm, preferably a thickness of 10 µm-250 µm. Further, porosity of the pores 12 formed in the heat insulation layer 10 is preferably in the range of 50-80%.

In general, the air has been known as an excellent heat insulation material having low thermal conductivity, but has not been used as an insulation material by convection. However, the heat insulation layer 10 applied to some embodiments of the present invention is configured of a web form having a plurality of fine pores, and thus air convection does not occur in the individual fine pores, to thereby trap (confine) air and represent an excellent thermal block property which air has.

Here, the spinning method that is applied to some embodiments of the present invention, may employ any one selected from general electrospinning, air-electrospinning (AES), electrospray, electrobrown spinning, centrifugal electrospinning, and flash-electrospinning.

A polymeric material used to make the heat insulation layer 10 may be made of one of, for example, oligomer polyurethane, and polymer polyurethane, PS (polystyrene), PVA (polyvinylalchol), PMMA (polymethyl methacrylate), PLA (polylactic acid), PEO (polyethyleneoxide), PVAc (polyvinylacetate), PAA (polyacrylic acid), PCL (polycaprolactone), PAN (polyacrylonitrile), PVP (polyvinylpyrrolidone), PVC (polyvinylchloride), nylon, PC (polycarbonate), PEI (polyetherimide), PVdF (polyvinylidene fluoride), PEI (polyetherimide), PES (polyesthersulphone) or a mixture thereof.

The solvent is at least one selected from the group consisting of DMA (dimethyl acetamide), DMF (N, N-dimethylformamide), NMP (N-methyl-2-pyrrolidinone), DMSO (dimethyl sulfoxide), THF (tetra-hydrofuran), DMAc (di-methylacetamide), EC (ethylene carbonate), DEC (diethyl carbonate), DMC (dimethyl carbonate), EMC (ethyl methyl carbonate), PC (propylene carbonate), water, acetic acid, and acetone.

The heat insulation layer 10 is prepared by the electrospinning method, and thus thickness of the heat insulation layer 10 is determined according to a spinning dose of a spinning solution. Accordingly, it is easy to have the heat insulation layer 10 made into a desired thickness.

As described above, since the heat insulation layer 10 is formed into a nanofiber web shape in which the nanofibers 14 are accumulated by a spinning method, the heat insulation layer 10 may be made of a type having a plurality of pores 12 without a separate process. It is also possible to adjust size of the pores according to a spinning dose of a spinning solution. Thus, since the multiple pores 12 can be finely made, heat blocking performance is excellent, to accordingly improve heat insulation performance.

Here, as the heat insulation layer 10 becomes thick, the heat insulation performance may be improved, and as the heat diffusion layer 20 becomes thick, the heat diffusion performance may be improved. Therefore, the thickness of each of the heat insulation layer 10 and the heat diffusion layer 20 may be adjusted in accordance with installation positions of the heat insulation layer 10 and the heat diffusion layer 20, to thereby achieve optimal performance.

The adhesive layer 30 is formed of an adhesive material having thermal conductivity so that heat generated by a heat generating component may be passed quickly to the heat diffusion layer 20. For example, the adhesive layer may be formed by using a conventional thermally conductive adhesive tape or thermally conductive adhesive sheet, and may be formed in a non-pore nanofiber web pattern by using an electrospinning method.

When the adhesive layer 30 is formed in a non-pore nanofiber web pattern, a thermally and electrically conductive adhesive material is formed by the following processes of: mixing any one of a thermally conductive metal such as Ni, Cu, or Ag having excellent thermal conductivity, carbon black, carbon nanotubes, graphene, and conductive polymers (PDOT) with an adhesive and a solvent, to thus prepare an adhesive material with a viscosity suitable for electrospinning; electrospinning the adhesive material to thus form nanofibers; and accumulating the nanofibers to then be formed into a non-pore nanofiber web pattern.

That is, the adhesive layer 30 may be formed by using the electrospinning method in the same manner as the method of forming the heat insulation layer 10, and thickness of the adhesive layer 30 is determined in accordance with the spinning dose of the adhesive material, to thus freely make the thickness of the adhesive layer 30.

In addition, the adhesive layer 30 may be also laminated on the heat insulation layer 10 and thus adhesive layers may be also provided on both surfaces of the heat radiation sheet.

Thus, the heat radiation sheet according to the first embodiment quickly diffuses the heat generated from a hot spot of the mobile terminal in the horizontal direction via the heat diffusion layer 20 to thus prevent a local region of the mobile terminal from being heated at a high temperature, and performs a heat insulation function in the vertical direction via the heat insulation layer 10, to thus block the heat generated from the hot spot from being delivered to the outside of the mobile terminal.

Figure 12:
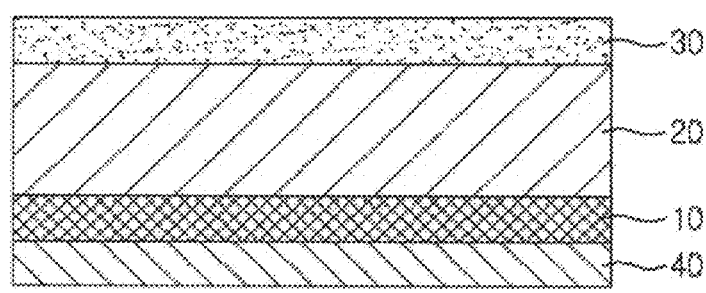
FIG. 12 is a cross-sectional view of a heat radiation sheet according to a second embodiment of the present invention.

FIG. 12 is a cross-sectional view of a heat radiation sheet according to a second embodiment of the present invention.

The heat radiation sheet in accordance with the second embodiment includes: a heat diffusion layer 20 that diffuses heat in the horizontal direction; a heat insulation layer 10 that is laminated on one surface of the heat diffusion layer 20 and blocks heat from being transferred in the vertical direction; an adhesive layer 30 that is laminated on the other surface of the heat diffusion layer 20; and a protective cover layer 40 that is laminated on the other surface of the heat insulation layer 10 on one surface of which the heat diffusion layer 20 is laminated to thus protect the heat insulation layer 10.

The protective cover layer 40 is attached to the heat insulation layer 10 to thus seal one surface of the heat insulation layer 10 to thereby enable pores in the heat insulation layer 10 to play a role of acting as an air chamber, and prevent external impact or other foreign matters from being introduced into the pores of the heat insulation layer 10.

The protective cover layer 40 may be made of a resin material such as a PET film or the like, and may also be made of a fiber material other than the resin material.

Figure 13:
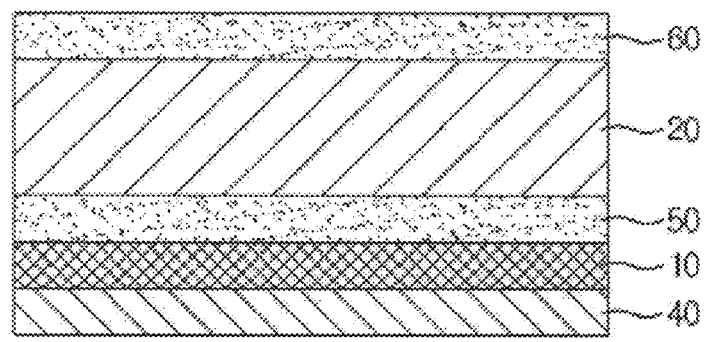
FIG. 13 is a cross-sectional view of a heat radiation sheet according to a third embodiment of the present invention.

FIG. 13 is a cross-sectional view of a heat radiation sheet according to a third embodiment of the present invention.

The heat radiation sheet according to the third embodiment includes: a heat diffusion layer 20 to diffuse heat in the horizontal direction; a first adhesive layer 50 laminated on one surface of the heat diffusion layer 20; a second adhesive layer 60 laminated on the other surface of the heat diffusion layer 20; a heat insulation layer 10 laminated on the first adhesive layer 50 to prevent heat from being transferred in the vertical direction; and a protective cover layer 40 laminated on the other surface of the heat insulation layer 10 on one surface of which first adhesive layer 50 is laminated to protect the heat insulation layer 10.

Here, the first adhesive layer 50 plays a role of serving to attach the heat insulation layer 10 to the heat diffusion layer 20 and may be formed of a non-pore nanofiber web type produced by the electrospinning method.

Then, the second adhesive layer 60 plays a role of serving to attach the heat radiation sheet to a component that needs the heat radiation sheet, and is the same as the adhesive layer 30 described in the first embodiment.

Figure 14:
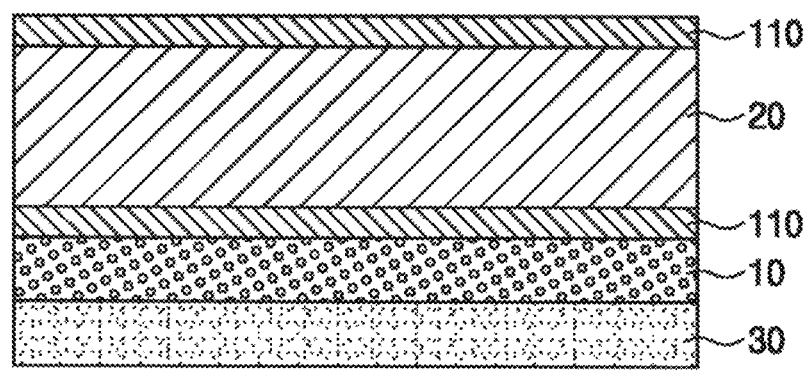
FIG. 14 is a cross-sectional view of a heat radiation sheet according to a fourth embodiment of the present invention

FIG. 14 is a cross-sectional view of a heat radiation sheet according to a fourth embodiment of the present invention.

The heat radiation sheet according to the fourth embodiment includes: a heat diffusion layer 20 that diffuses heat in the horizontal direction; a heat insulation layer 10 that is laminated on one surface of the heat diffusion layer 20 and blocks heat from being transferred in the vertical direction; and an adhesive layer 30 that is laminated on the other surface of the heat insulation layer 10 on one surface of which the heat diffusion layer 20 is laminated, wherein oxidation preventive films 110 are formed on surfaces of the heat diffusion layer 20 to prevent the heat diffusion layer 20 from being oxidized.

The oxidation preventive films 110 prevent the heat diffusion layer 20 from being oxidized when an oxidation allowable material such as Cu is used as the heat diffusion layer 20. The oxidation preventive films 110 may be formed by coating an anti-oxidation material on both surfaces of the heat diffusion layer 20, or by oxidizing both the surfaces of the heat diffusion layer 20 to thus form oxide films on both the surfaces of the heat diffusion layer 20.

Here, nickel (Ni) may be used as the anti-oxidation material, and the oxidation preventive films 110 are prepared specifically by coating Ni to a thickness of about 0.1~0.3 μm.

As described above, the heat radiation sheet according to the fourth embodiment prevents the heat diffusion layer 20 from being oxidized by forming the oxidation preventive films 110 on both the surfaces of the heat diffusion layer 20, thereby preventing the heat diffusion layer 20 from deteriorating the performance due to the oxidation.

Figure 15:
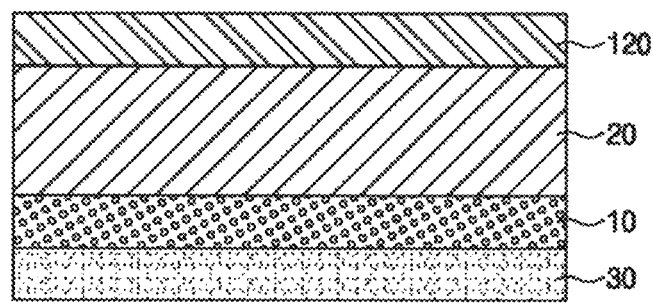
FIG. 15 is a cross-sectional view of a heat radiation sheet according to a fifth embodiment of the present invention.

FIG. 15 is a cross-sectional view of a heat radiation sheet according to a fifth embodiment of the present invention.

The heat radiation sheet according to the fifth embodiment includes: a heat diffusion layer 20 that diffuses heat in the horizontal direction; a heat insulation layer 10 that is laminated on one surface of the heat diffusion layer 20 and blocks heat from being transferred in the vertical direction; an adhesive layer 30 that is laminated on the other surface of the heat insulation layer 10 on one surface of which the heat diffusion layer 20 is laminated; and an electrically conductive adhesive layer 120 that is laminated on the other surface of the heat diffusion layer 20 for absorbing an electromagnetic wave.

The electrically conductive adhesive layer 120 may be formed by an electrospinning apparatus, in the same manner as the method of forming the heat insulation layer 10 and may be attached on the other surface of the heat diffusion layer 20 on the one surface of which the heat insulation layer 10 is laminated.

When the electrically conductive adhesive layer 120 is formed by the electrospinning apparatus, a spinning solution is prepared by mixing a polymer material that can be electrospun, an electrically conductive adhesive material, and a solvent at a predetermined ratio, the spinning solution is electrospun to thus form nanofibers, and the nanofibers are accumulated to then be formed in a non-pore nanofiber web pattern.

As described above, the heat radiation sheet according to the fifth embodiment includes the electrically conductive adhesive layer 120 for absorbing an electromagnetic wave to thus serve as an electromagnetic wave shielding role.

Figure 16:
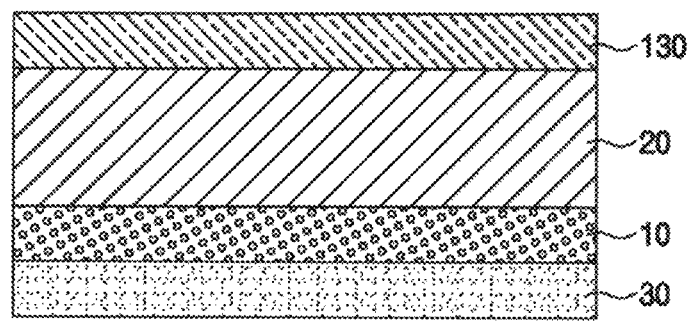
FIG. 16 is a cross-sectional view of a heat radiation sheet according to a sixth embodiment of the present invention.

FIG. 16 is a cross-sectional view of a heat radiation sheet according to a sixth embodiment of the present invention.

The heat radiation sheet according to the sixth embodiment includes: a heat diffusion layer 20 that diffuses heat in the horizontal direction; a heat insulation layer 10 that is laminated on one surface of the heat diffusion layer 20 and blocks heat from being transferred in the vertical direction; an adhesive layer 30 that is laminated on the other surface of the heat insulation layer 10 on one surface of which the heat diffusion layer 20 is laminated; and a color cover layer 130 that is laminated on the other surface of the heat diffusion layer 20 and having a variety of different colors.

When the heat radiation sheet according to sixth embodiment of the present embodiment is used in a component that is exposed to the outside, a color cover layer 130 with a variety of colors may be provided on a portion exposed to the outside of the heat radiation sheet to thus achieve a beautiful design.

The color cover layer 130 may be formed by coating colored pigments on the other surface of the heat diffusion layer 20, or by attaching a single-sided adhesive tape having a color on the other surface of the heat diffusion layer 20.

Figure 17:
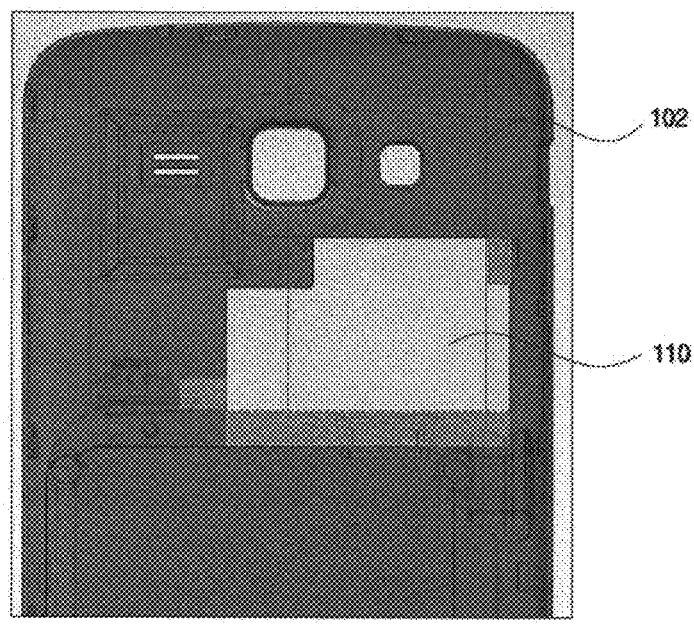
FIG. 17 is a plan view of a cover to which a heat radiation sheet is attached according to the sixth embodiment of the present invention.

For example, as shown in FIG. 17, when the heat radiation sheet 110 is attached to an inner surface of a cover 102, the inner surface of the cover 102 is exposed to the outside if the cover 102 is released from a mobile terminal main body. Thus, the color cover layer 130 is formed to be white when the color of the cover 102 is white, and is formed to be black when the cover thereof is black, and the like. That is, the color cover layer 130 is formed to become the same color as that of the cover 102.

Figure 18:
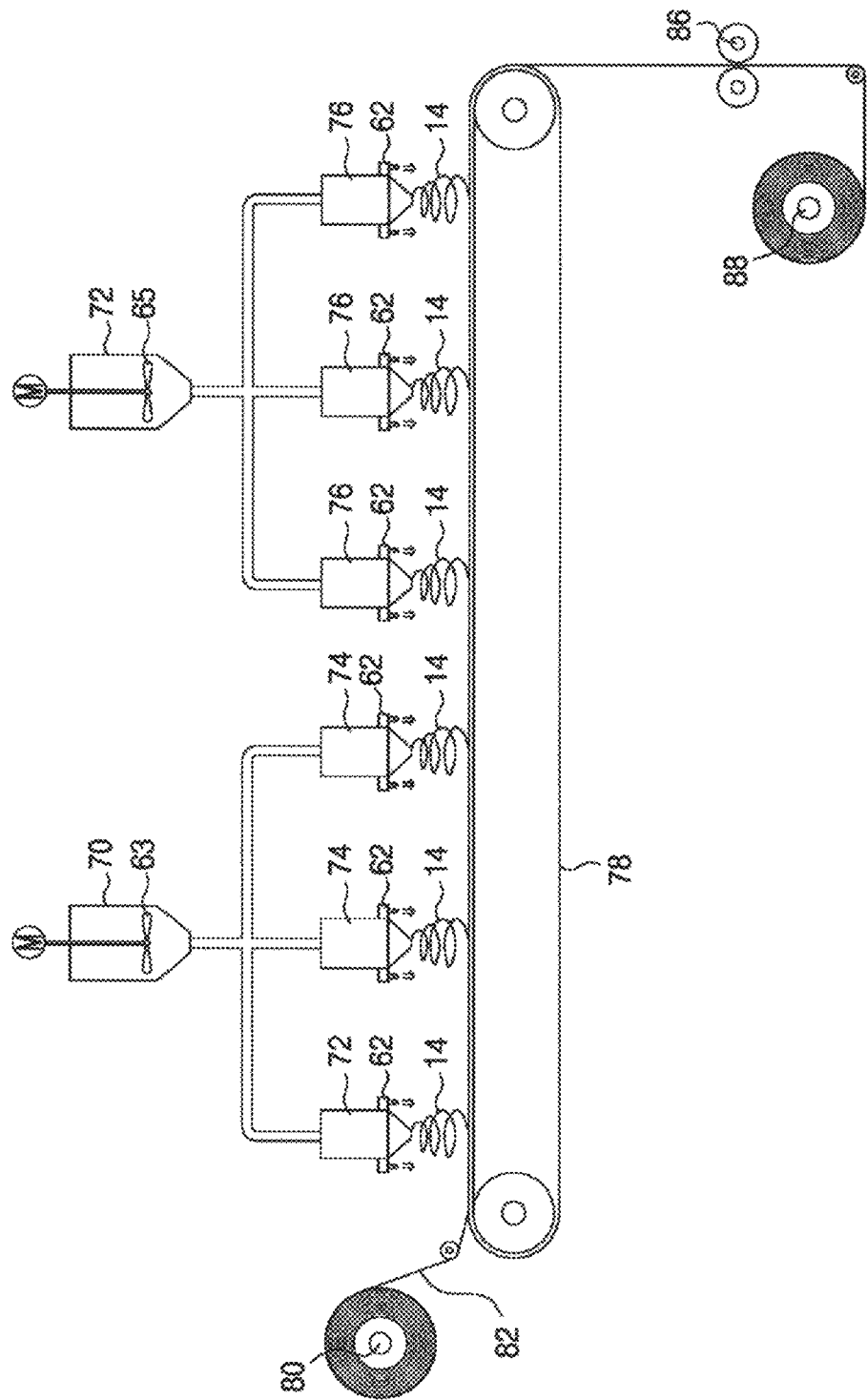
FIG. 18 is a schematic diagram of an electrospinning apparatus for producing a heat radiation sheet of the present invention.
Figure 19:
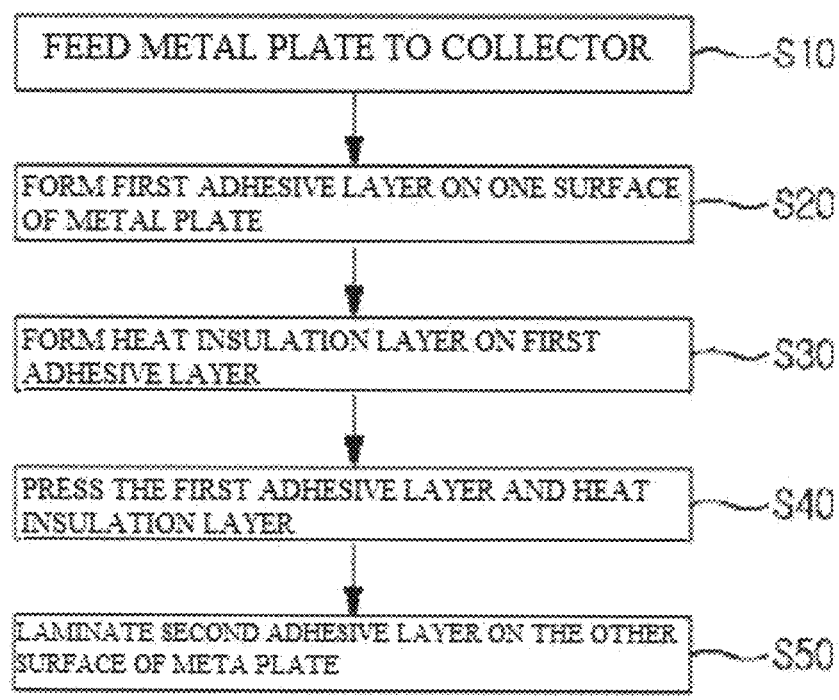
FIG. 19 is a flowchart illustrating a process of manufacturing an example of a heat radiation sheet according to the present invention.

Referring to FIGS. 18 and 19, a method of producing a heat radiation sheet according to some embodiments of the present invention will follow.

First, when a collector 78 is driven, a metal plate 82 wound around a metal plate roll 80 is fed to the collector 78 (S10).

Then, a high voltage electrostatic force is applied between the collector 78 and first spinning nozzles 74 and thus a conductive adhesive material is made into nanofibers 14 from the first spinning nozzles 74. Then, the nanofibers 14 are spun on the surface of the metal plate 82. In this case, the nanofibers 14 are accumulated on the surface of the metal plate 82, to thus from a first adhesive layer 50 (S20).

Here, when the nanofibers 14 are spun from air injection apparatuses 62 that are respectively mounted in the first spinning nozzles 72, air is injected onto the nanofibers 14 so that the nanofibers 14 do not blow and may be collected and integrated on the surface of the metal plate 82.

Then, when the collector 78 is driven, the metal plate 82 on which the first adhesive layer 50 is laminated is moved to the lower sides of second spinning nozzles 76, and a spinning solution is made into nanofibers 14 in the second spinning nozzles 76 to then be spun on the surface of the first adhesive layer 50. Then, the nanofibers are accumulated on the surface of the first adhesive layer 50, to thereby form a heat insulation layer 10 having a plurality of pores (S30).

In addition, a sheet in which the first adhesive layer and the heat insulation layer are laminated on the surface of the metal plate is pressed into a predetermined thickness while passing through a pressing roller 86, to then be wound on a sheet roll 88 (S40).

Then, a second adhesive layer is attached on the other surface of the metal plate, to thereby completely prepare the heat radiation sheet (S50).

Here, the second adhesive layer may be separately prepared and attached to the other surface of the metal plate. In addition, the second adhesive layer may be formed into a nanofiber web pattern by spinning the nanofibers on the other surface of the metal plate by using the electrospinning apparatus.

Figure 20:
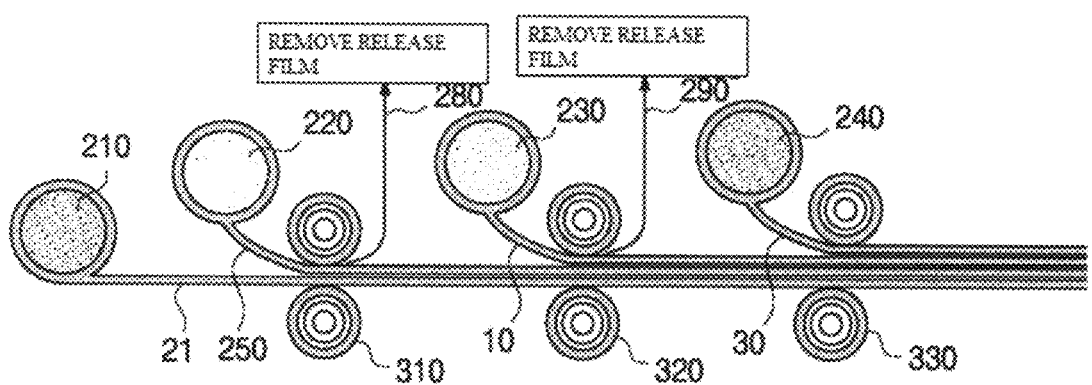
FIG. 20 is a process diagram illustrating a process of manufacturing another example of a heat radiation sheet according to the present invention.

FIG. 20 is a configurational view showing another example of a manufacturing process of a heat radiation sheet according to some embodiments of the present invention.

In some embodiments, the heat radiation sheet manufacturing process includes: separately preparing a metal plate 21 that makes up a heat diffusion layer 20, a heat insulation layer 10, and an adhesive layer 30; and then thermally laminating the metal plate 21, the heat insulation layer 10, and the adhesive layer 30.

Specifically, the metal plate 21 is supplied from a metal plate roll 210, and a hot melt film 250 supplied from a hot melt film roll 220 is laminated on the surface of the metal plate 21, to then pass through a first pressing roller 310. Thus, the hot melt film 250 is thermally laminated on the surface of the metal plate 21.

Here, a release film 280 attached to the hot melt film is removed.

Then, a heat insulation layer 10 supplied from a heat insulation layer roll 230 is laminated on the surface of the hot melt film 250 to then pass through a second pressing roller 320. In this case, the metal plate 21 and the heat insulation layer 10 are thermally laminated by the hot melt film 250.

Here, a release film 290 attached to the heat insulation layer 10 is removed.

Then, an adhesive layer 30 supplied from an adhesive layer roll 240 is laminated on the surface of the heat insulation layer 10, to then pass through a third pressing roller 330. Then, the adhesive layer 30 is thermally laminated on the surface of the heat insulation layer 10.

Figure 21:
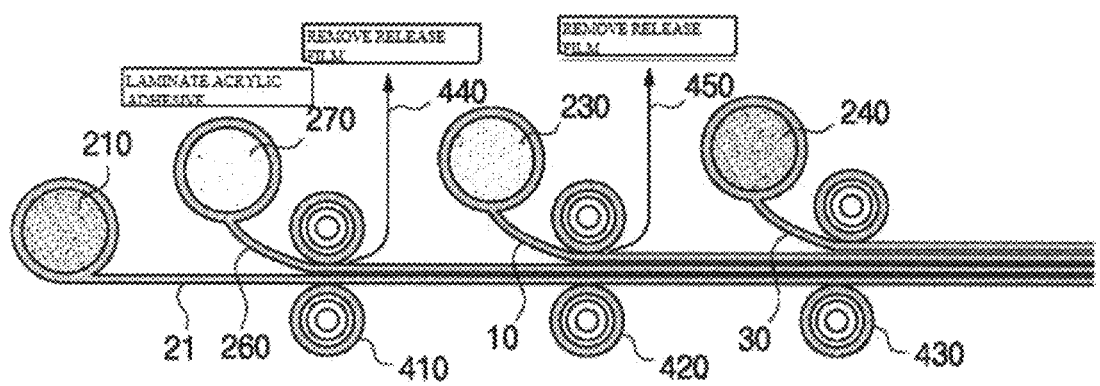
FIG. 21 is a process diagram illustrating a process of manufacturing still another example of a heat radiation sheet according to the present invention.

FIG. 21 is a configurational view showing still another example of a manufacturing process of a heat radiation sheet according to some embodiments of the present invention.

In some embodiments, the heat radiation sheet manufacturing process employs a cold lamination method that can reduce costs compared to the above-described thermal lamination.

Specifically, a metal plate 21 is supplied from a metal plate roll 210, and an acrylic adhesive 260 supplied from an acrylic adhesive roll 270 is laminated on the surface of the metal plate 21, to then be cold laminated while passing through a first pressing roller 410.

In this case, the first pressing roller 410 employs a roller to which heat is not applied but only pressure is applied. Then, a release film 440 attached to the acrylic adhesive 260 is removed.

Then, a heat insulation layer 10 supplied from a heat insulation layer roll 230 is laminated on the surface of the acrylic adhesive 260 to then pass through a second pressing roller 420. In this case, the metal plate 21 and the heat insulation layer 10 are cold laminated by the acrylic adhesive 260.

Here, a release film 450 attached to the heat insulation layer 10 is removed.

Then, an adhesive layer 30 supplied from an adhesive layer roll 240 is laminated on the surface of the heat insulation layer 10, to then pass through a third pressing roller 430. Then, the adhesive layer 30 is cold laminated on the surface of the heat insulation layer 10.

Figure 22:
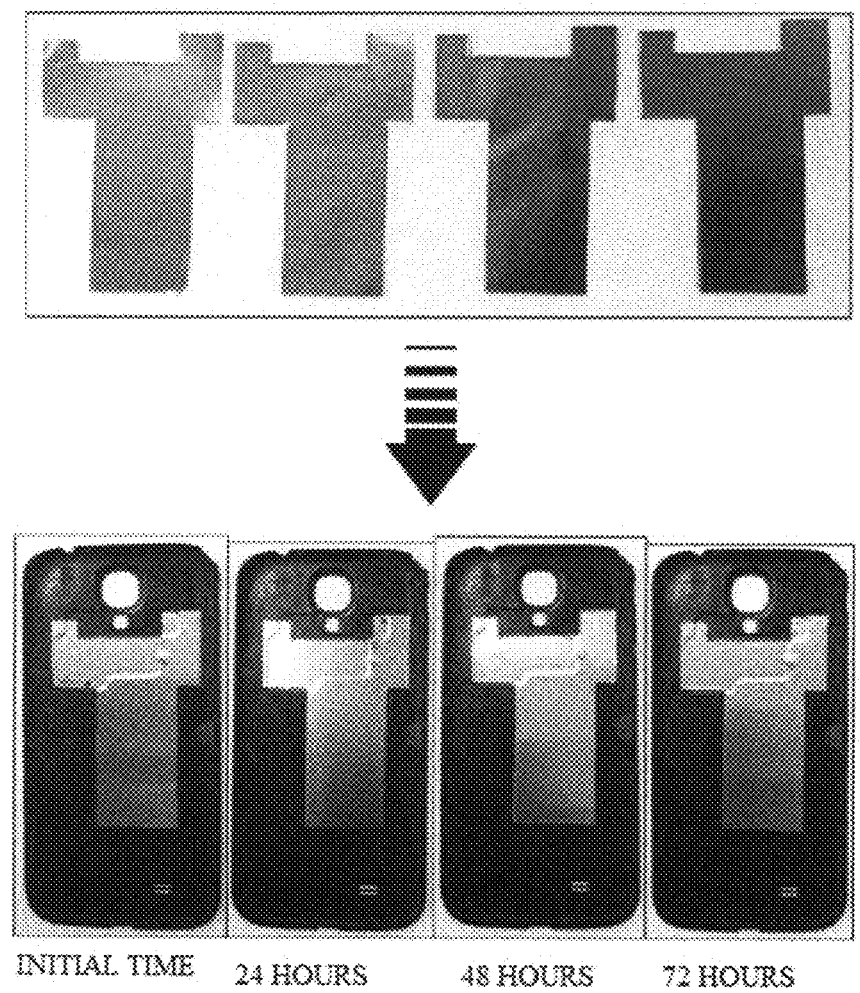
FIG. 22 is a photograph observing whether or not a change of thermal properties over time of a heat radiation sheet occurs according to an embodiment of the present invention.
Figure 23:
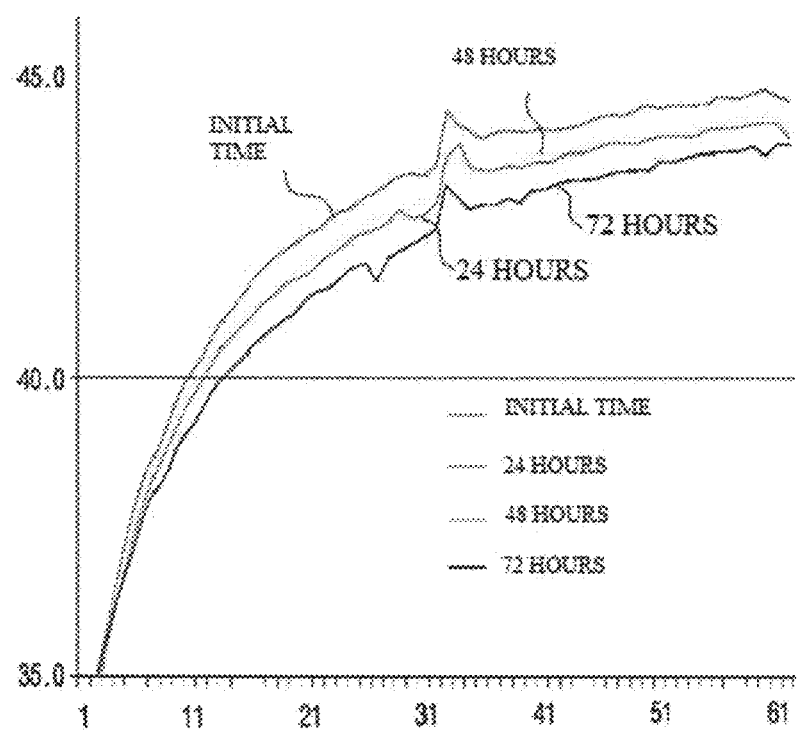
FIG. 23 is a graph of a result of comparing heat radiation properties over time of a heat radiation sheet according to an embodiment of the present invention.

FIG. 22 is a picture to observe whether or not there occur changes in thermal characteristics over time of the heat radiation sheet according to an embodiment of the present invention, and FIG. 23 is a graph showing results that are obtained by comparing radiating characteristics over time of the heat radiation sheet according to an embodiment of the present invention.

First, as shown in FIG. 22, a thermal imaging test was performed after leaving a heat radiation sheet for 24 hours, 48 hours, and 72 hours under the high temperature and high humidity environmental conditions (85° C., and 85% Relative Humidity (RH)), and then it was observed whether or not there occur changes in thermal characteristics according to the surface oxidation.

Here, it was confirmed that a copper plate that forms a heat diffusion layer of the heat radiation sheet was oxidized according to lapse of time.

Then, the following Table 1 illustrates a change in the surface resistance over time. The surface resistance changes over time. An initial surface resistance is 6.7 Ω/sq. It can be seen that the surface resistance is 12.1 Ω/sq according to lapse of 72 hours.

TABLE 1

| (Reference: 1 Ω/sq or less) | |
|---|---|
| 85° C., 85% RH | MΩ/sq |
| Initial | 6.7 |
| 24 hours later | 10.1 |
| 48 hours later | 10.8 |
| 72 hours later | 12.1 |

Thus, in the case that the oxidation preventive layer is formed on the surface of the heat diffusion layer, oxidation of the copper plate can be prevented.

Then, as shown in the graph shown in FIG. 23, although the copper plate is oxidized over time, it is confirmed that there is no substantial difference in the thermal characteristics, i.e., in the radiating characteristics.

Figure 24:
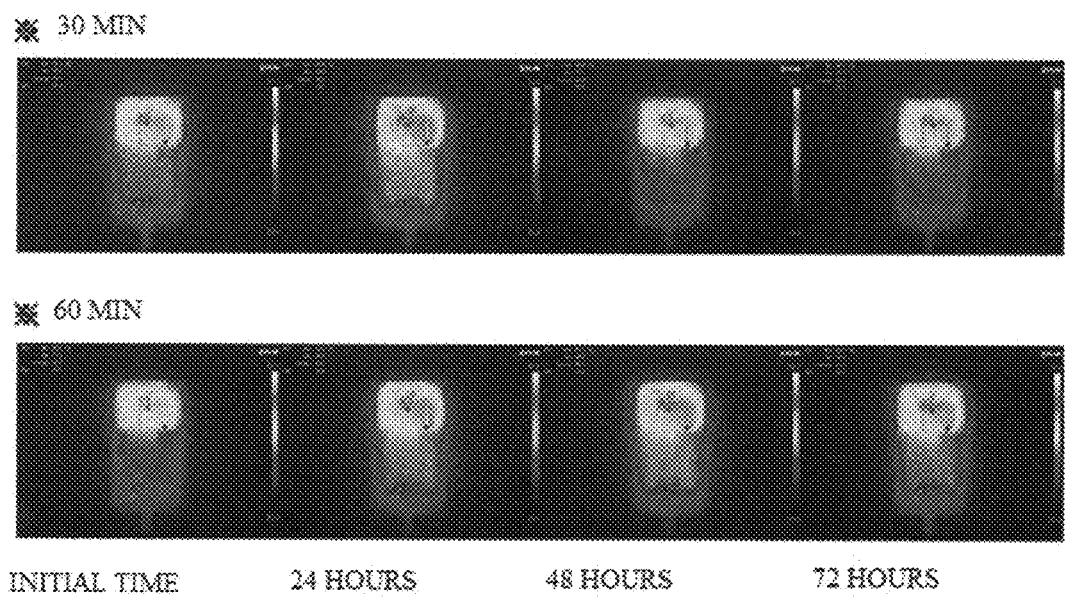
FIG. 24 shows photographs of thermal images over time of a heat radiation sheet according to an embodiment of the present invention.

FIG. 24 is pictures showing thermal images over time of the heat radiation sheet according to an embodiment of the present invention.

As shown in FIG. 24, when thermal imaging photos were taken after leaving the heat radiation sheet for 24 hours, 48 hours, and 72 hours under the high temperature and high humidity environmental conditions (85° C., and 85% Relative Humidity (RH)), and a thermal imaging photo after lapse of initial 30 minutes and a thermal imaging photo after lapse of 30 minutes after leaving the radiation sheet alone for 72 hours were compared with each other, it can be confirmed that there was little change in thermal characteristics.

Likewise, as shown in FIG. 24, although a thermal imaging photo after lapse of initial 60 minutes and a thermal imaging photo after lapse of 60 minutes after leaving the heat radiation sheet alone for 72 hours were compared with each other, it can be confirmed that there is no substantial difference in thermal characteristics.

Figure 25:
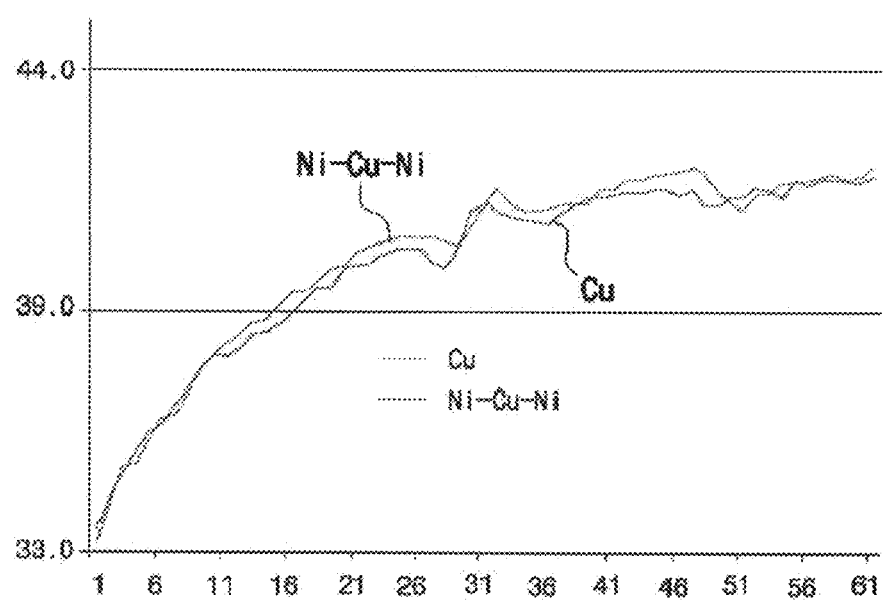
FIG. 25 is a graph of a result of comparing heat radiation properties of a pure copper plate and a Ni-coated copper plate for oxidation of the copper plate of a heat radiation sheet according to an embodiment of the present invention.

FIG. 25 is a graph showing results that are obtained by comparing radiating characteristics of a pure copper plate and a Ni-coated copper plate of the heat radiation sheet according to an embodiment of the present invention, and FIGS. 26A to 26D are pictures showing thermal images over time of a pure copper plate and a Ni-coated copper plate of the heat radiation sheet according to an embodiment of the present invention.

As shown in FIG. 25, it can be confirmed that there is no substantial difference in radiating characteristics between a pure copper plate and a Ni-coated copper plate.

Figure 26:
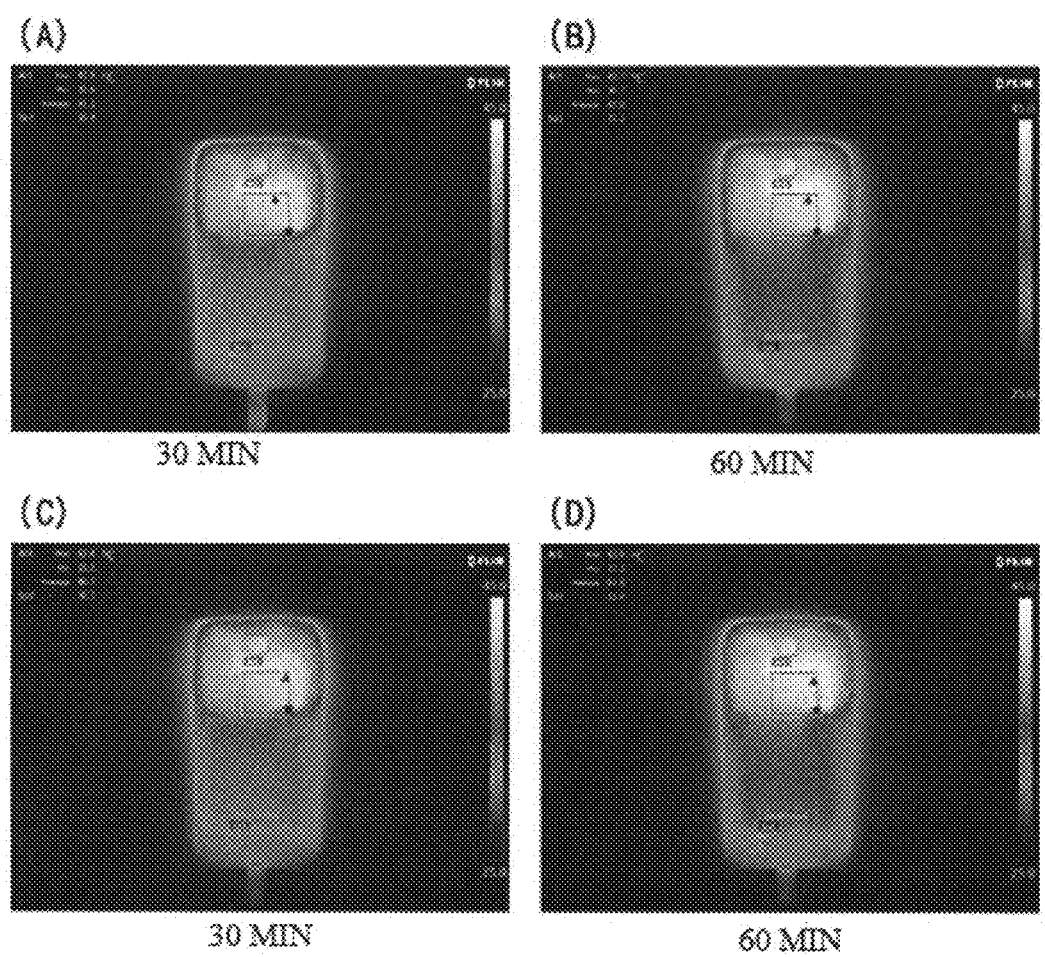
FIG. 26 shows photographs of thermal images over time of a pure copper plate and a Ni-coated copper plate for oxidation of the copper plate of a heat radiation sheet according to an embodiment of the present invention.

In addition, as shown in FIG. 26, when a thermal image photo after lapse of 30 minutes (A of FIG. 26) and a thermal image photo after lapse of 60 minutes (B of FIG. 26) are compared with each other in the case of using a pure copper plate, it can be confirmed that there is no substantial difference in thermal characteristics. Likewise, as shown in C and D of FIG. 26, when a thermal image photo after lapse of 30 minutes (C of FIG. 26) and a thermal image photo after lapse of 60 minutes (D of FIG. 26) are compared with each other in the case of using a Ni-coated copper plate, it can be confirmed that there is no substantial difference in thermal characteristics.

As described above, the present invention has been described with respect to particularly preferred embodiments. However, the present invention is not limited to the above embodiments, and it is possible for one who has an ordinary skill in the art to make various modifications and variations, without departing off the spirit of the present invention. Thus, the protective scope of the present invention is not defined within the detailed description thereof but is defined by the claims to be described later and the technical spirit of the present invention.

INDUSTRIAL APPLICABILITY

The present invention may be applied to a heat radiation member that may radiate and block heat and a mobile terminal having the same, in which heat generated from a hot spot of the mobile terminals is efficiently radiated and insulated, to thus minimize the thermal influence applied to internal components in the mobile terminal.

The invention claimed is:

1. A heat radiation member comprising:
   a heat radiation sheet configured to disperse and radiate transferred heat, and block and insulate the transferred heat; and
   a passage formed in the heat radiation sheet and configured to pass a communication radio signal, wherein the passage comprises at least one punching area penetrating the heat radiation sheet,
   wherein the heat radiation sheet comprises: a heat diffusion layer configured to disperse the transferred heat in a horizontal direction; a heat insulation layer formed on one surface of the heat diffusion layer to block and insulate the transferred heat from being transferred in a vertical direction; and an adhesive layer formed on the other surface of the heat diffusion layer, and
   wherein the heat insulation layer is formed of a nanofiber web layer having a plurality of pores, the plurality of pores forming a plurality of air-chamber.

2. The heat radiation member of claim 1, wherein the at least one punching area is spaced apart from each other, and is punched in a "L"-lettered shape.

3. The heat radiation member of claim 1, wherein the heat diffusion layer is formed of a metal plate made of Al, Ni, Cu, Ag, or an alloy containing at least two or more of Al, Ni, Cu, and Ag.

4. The heat radiation member of claim 1, wherein the adhesive layer is formed of a conductive adhesive material including an adhesive and any one of a thermally conductive metal, a carbon black, a carbon nanotube, a graphene, and a heat conducting polymer (PDOT).

5. The heat radiation member of claim 1, further comprising a protective cover layer that is laminated on the heat insulation layer for protecting the heat insulation layer.

6. The heat radiation member of claim 1, further comprising an oxidation preventive film that is laminated on the heat diffusion layer to thus prevent the heat diffusion layer from being oxidized.

7. The heat radiation member of claim 1, further comprising an electrically conductive adhesive layer that is laminated on the heat diffusion layer to thus absorb electromagnetic waves.

8. The heat radiation member of claim 7, wherein the electrically conductive adhesive layer is formed by an electrospinning method, or by attaching an electrically conductive adhesive film to the heat diffusion layer.

9. The heat radiation member of claim 1, further comprising a color cover layer that is laminated to the heat diffusion layer and has a variety of different colors.

10. The heat radiation member of claim 9, wherein the color cover layer is formed by coating a color pigment on the heat diffusion layer, or by attaching an adhesive tape having a color to the heat diffusion layer.

* * * * *